United States Patent
Blanken et al.

(10) Patent No.: US 6,717,472 B2
(45) Date of Patent: Apr. 6, 2004

(54) ELECTRONIC CIRCUIT COMPRISING AN AMPLIFIER WITH IMPROVED TRANSIENT SPEED

(75) Inventors: Pieter Gerrit Blanken, Eindhoven (NL); Franciscus Adrianus Cornelis Maria Schoofs, Eindhoven (NL); Mike Hendrikus Splithof, Nijmegen (NL); Paulus Petrus Franciscus Maria Bruin, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/116,500

(22) Filed: Apr. 4, 2002

(65) Prior Publication Data

US 2002/0158692 A1 Oct. 31, 2002

(30) Foreign Application Priority Data

Apr. 9, 2001 (EP) .............................. 01201299

(51) Int. Cl.$^7$ ............................................. H03G 3/20
(52) U.S. Cl. ...................................... 330/296; 330/285
(58) Field of Search .................... 330/85, 285, 290, 330/296

(56) References Cited

U.S. PATENT DOCUMENTS 5,483,198 A * 1/1996 Nunn ..................... 330/285 X

* cited by examiner

Primary Examiner—Steven J. Mottola
(74) Attorney, Agent, or Firm—Aaron Walker

(57) ABSTRACT

An electronic circuit comprising an amplifier includes an output terminal (OUT) for supplying an output signal ($V_{out}$) to a load, the amplifier comprising an output transistor ($N_2$, $P_1$) having a first main terminal coupled to a supply voltage terminal ($V_{SS}$, $V_{DD}$) of the amplifier, a second main terminal coupled to the output terminal (OUT), and a control terminal. In order to avoid that the output transistor ($N_2$, $P_1$) can enter its linear state which would cause the amplifier to act unacceptably slow for some purposes, the electronic circuit further comprises a controller adapted to prevent the output transistor ($N_2$, $P_1$) to enter its linear state whereby the controller is arranged for reducing a control voltage ($V_{cntrl}$) between the control terminal and the first main terminal when an output voltage ($V_{out}$) between the second main terminal and the first main terminal is below a defined level.

6 Claims, 8 Drawing Sheets

ELECTRONIC CIRCUIT COMPRISING AN AMPLIFIER WITH IMPROVED TRANSIENT SPEED

BACKGROUND AND SUMMARY

The invention relates to an electronic circuit comprising an amplifier comprising an output terminal for supplying an output signal to a load, the amplifier comprising an output transistor having a first main terminal coupled to a supply voltage terminal of the amplifier, a second main terminal coupled to the output terminal, and a control terminal.

Such an electronic circuit is known from the general state of the art as shown in FIG. 1. The known circuit comprises an amplifier having an amplifying complementary (class-AB) output stage driven by a class-A amplifying stage. The output stage may be followed by a unity-voltage-gain (follower-type) output stage (not drawn). Such an amplifier is e.g. used in integrated drivers for CRT'S.

A high-side output branch includes n-type transistor $N_1$ in common-drain configuration and p-type transistor $P_1$ in common gate configuration. The gate of $P_1$ is coupled to the positive supply voltage by means of a bias voltage source $E_1$ of appropriate value. In almost every technology the speed of the p-type transistor is worse than than of the n-type transistor, among others due to the difference in carrier mobility's. In applications, where the speed is at the edge of what the technology offers, the p-type transistor is preferably used in common-gate configuration, as the bandwidth of the transfer from source signal current to drain signal current approaches the transistor's transition frequency $f_T$. A low-side output transistor $N_2$ is biased in common-source configuration. The amplifying stage consists of differential transconductor (shown as a box $g_m$ in the lower part) loaded by two current sources $J_1$ and $J_2$. The differential transconductor converts the differential input voltage $V_{in+}-V_{in-}$ to a differential output current $I_{out+}-I_{out-}=g_m (V_{in+}-V_{in-})$, in which $g_m$ is the transconductance. The bias current value of both current sources $J_1$ and $J_2$ is controlled by a common-mode control loop (not shown), which essentially controls the quiescent current in the output transistors $N_1$, $P_1$ and $N_2$.

The voltage gain of output transistors $P_1$ and $N_2$ can be large provided that they are biased in saturation and not in the linear region. Clamping circuits can monitor the drain-to-gate voltage and take appropriate action whenever these voltages tend to enter the linear region.

FIG. 2 shows a known clamp circuit. This type of clamp circuit is generally denoted as a "Baker" clamp. In normal operation the collector-base junction is reverse biased, diode $D_1$ is reversed biased and diode $D_2$ is forward biased. Whenever the collector voltage tends to drop to below the base voltage the diode $D_1$ is forward biased. The bipolar transistor $N_1$ then operates at near-zero collector-base voltage and the excess base drive current is bypassed via $D_1$. As a results the bipolar transistor $N_1$ is kept out of saturation. The "Baker" clamp principle can also be applied to MOS transistors.

FIG. 3 shows a generalized form of the clamp circuit according to FIG. 2. The source of transistor NN is connected to the drain of the output transistor $N_2$. The gate of NN is connected to an appropriate voltage level, here symbolized by $E_{b1}$. In normal operation transistor NN is cut off. Whenever $N_2$'s drain voltage decreases to more than a threshold voltage below NN's gate voltage, transistor NN becomes conductive and its increasing drain current can be used in the driving circuit DRV to reduce the gate drive of output transistor $N_2$ to keep $N_2$ in saturation.

FIG. 4 shows another generalized form of the clamp circuit according to FIG. 2. The gate of transistor PP senses the drain voltage of output transistor $N_2$. In normal operation the transistors NN and PP are cut off. Whenever $N_2$'s drain voltage decreases too much (to be set by the value of $E_{b1}$ and threshold voltages of NN and PP) the transistor pair NN/PP becomes conductive and its increasing channel current can be used in driving circuit DRV to reduce the gate drive of output transistor $N_2$. Contrary to the circuit principle of FIG. 3 the clamping current is not conducted by the output transistor $N_2$.

FIG. 5 shows an input signal attenuator, known from U.S. Pat. No. 5,304,865. It comprises a MOS transistor NN and a resistor $R_3$, to be used in conjunction with a comparator. The source node of the MOS transistor NN can be used to sense the drain voltage. As long as this voltage is higher than the gate voltage, the MOS transistor is in saturation and the channel is cut off. The source voltage is approximately equal to the gate voltage. If the drain voltage falls below the gate bias voltage, the MOS transistor NN is rendered conductive in the linear range and the source voltage follows the drain voltage.

For some applications it can (unintentionally) occur that the output voltage $V_{out}$ at the output terminal OUT is so low that the transistor $N_2$ enters its linear operating state. This causes the amplifier to react relatively slow. A similar situation, with regard to the combined transistor pair $N_1/P_1$, occurs when the output voltage $V_{out}$ becomes too high. The former situations can occur when the amplifier is for instance used as a CRT-cathode-driving amplifier. High voltages characterize it: the applied supply voltage $E_{sup}$ and the required output voltage $V_{out}$ swing exceed the allowable gate-source voltage of for instance the transistor $N_2$ (some 20V) by far. The supply voltage $E_{sup}$ can range between 50V and 250V and the required peak-to-peak output voltage $V_{out}$ swing ranges from 40V (monochrome monitors), via 100–150V (color television) to 200V (color projection television). These applications require a speed (bandwidth, slew rate, rise time etc.) which is at the edge of what technology offers. It therefore is of prime importance that the parasitic capacitances at the gates of $N_1$ and $N_2$ in FIG. 1 are minimized.

In order to get the highest speed as possible it is necessary to avoid the output voltage $V_{out}$ to become too high or too low, so that the transistor $N_2$ and the combined transistor pair $N_1/P_1$ are kept in their normal state of operation. In prior art circuits this is accomplished by the application of, for instance, one of the circuits as shown in FIGS. 2–4. Further the requirements for a low power consumption dictates low bias currents.

In the "Baker" clamp of FIG. 2 the clamping diode $D_1$ needs to withstand a reverse-bias voltage far exceeding 10V. This implies that the shallow-p (SP) to n-epitaxial layer must be used. In a junction-isolated technology forward biasing of the SP-epi junction has the disadvantage that a parasitic substrate pnp transistor is activated: the SP region acts as emitter, the epilayer as base and the p-type substrate as collector. To reduce the pnp current gain the SP-epi junction has to be surrounded as much as possible by high-dope n-type material (buried-n and deep-n diffusions). The consequences are severe: the allowable reverse-bias voltage across the diode $D_1$ is reduced, and the layout size and thus parasitic capacitances are increased. For high reverse-bias voltages a series connection of more diodes might be needed, which increases layout size and parasitic capacitances even more. Thus the "Baker" clamp of FIG. 2 offers too high parasitic capacitance and cannot be applied if a high speed is important.

The generalized "Baker" clamp principles of FIG. 3 and FIG. 4 cannot be be applied, because the clamping transistors are tied to the high-voltage-swing node with their gate or their source, which is not allowed in normal IC-processes. (The transistors can be damaged).

For detecting whether the output voltage $V_{out}$ is too low (or too high), the circuit shown in FIG. 5 can be used (in which the source voltage of the MOS-transistor NN forms an input voltage for a comparator).

It is an object of the invention to provide an electronic circuit provided with an amplifier having a high (transient) speed irrespective whether the amplifier is applied in a low, medium, or high voltage electronic system.

To this end, according to the invention, an electronic circuit is provided comprising:

an amplifier comprising an output terminal for supplying an output signal to a load, the amplifier comprising an output transistor having a first main terminal coupled to a supply voltage terminal of the amplifier, a second main terminal coupled to the output terminal, and a control terminal; and control means for avoiding the output transistor to enter its linear state, the control means being arranged to reduce a control voltage between the control terminal and the first main terminal when an output voltage between the second main terminal and the first main terminal is below a defined level.

The invention is based on the insight that if the voltage across the output transistor becomes too low, as a consequence of which the output transistor unintentionally enters its linear operating state, this is in fact caused by a too high control voltage at the output transistor. Thus by reducing the control voltage, when the voltage across the main current path of the output transistor tends to become too low, the voltage across the said main current path will no longer decrease. (In fact a negative feedback loop is created) Thus the output transistor stays in its normal state of operation thereby avoiding the amplifier to react with reduced speed.

In an embodiment of a circuit according to the invention the control means comprises level detection means for, during operation of the electronic circuit, supplying a substantial change in voltage difference when the output voltage becomes lower than the defined level, and transconductor means for supplying a control current to the amplifier for reducing the control voltage on respond to the control current. Due to the fact that the level detection means delivers a substantial, thus not a very small, change in voltage difference it is assured that the control voltage is only adapted when needed, and not by an undesired offset-voltage, which may for instance be in the transconductor means. This makes the circuit easier to design (less sensitive to design parameters) and more reliable.

BRIEF DESCRIPTION OF THE DRAWINGS

Further advantageous embodiments of the invention are specified in dependent claims.

The invention will be described in more detail with reference to the accompanying drawing, in which.

In these figures parts or elements having like functions or purposes bear the same reference symbols.

DETAILED DESCRIPTION

Figure 1:
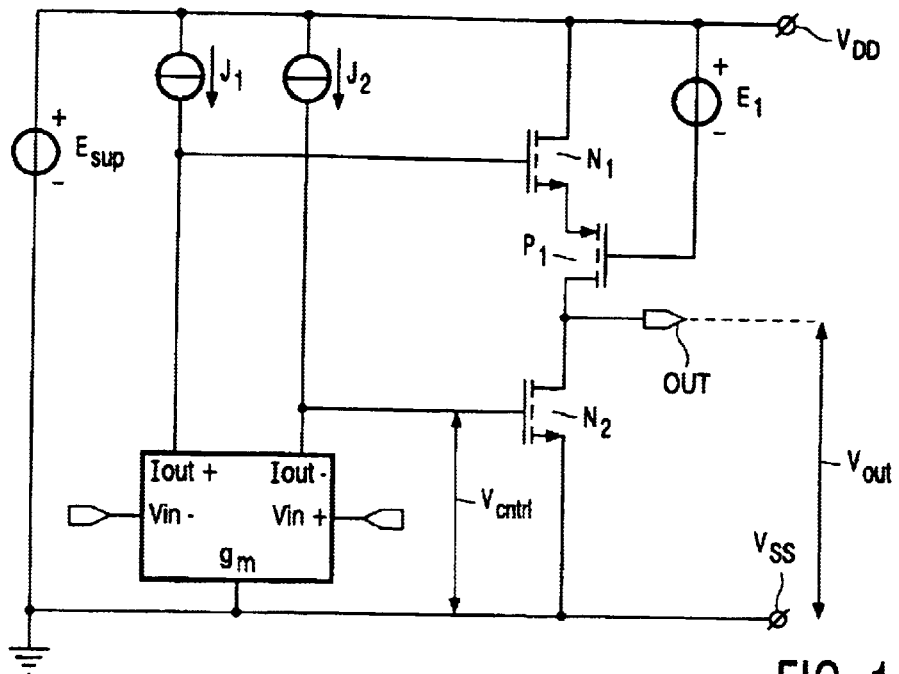
FIG. 1 is a circuit diagram of a known amplifier.
Figure 2:
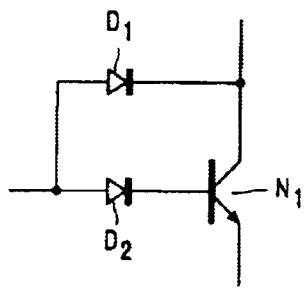
FIG. 2 is a circuit diagram of a known clamp circuit.
Figure 3:
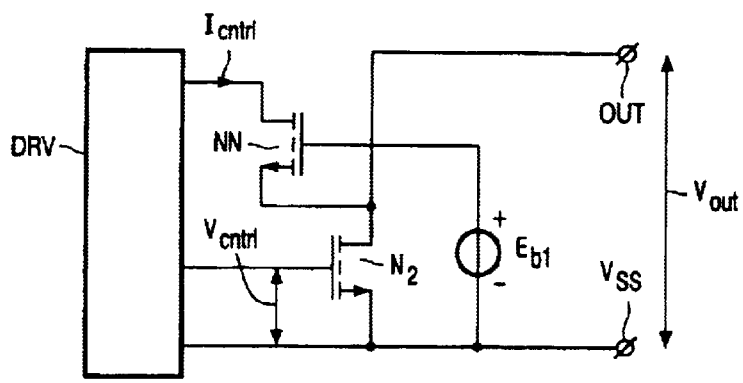
FIG. 3 is a circuit diagram of a generalized form of the clamp circuit according to FIG. 2.
Figure 4:
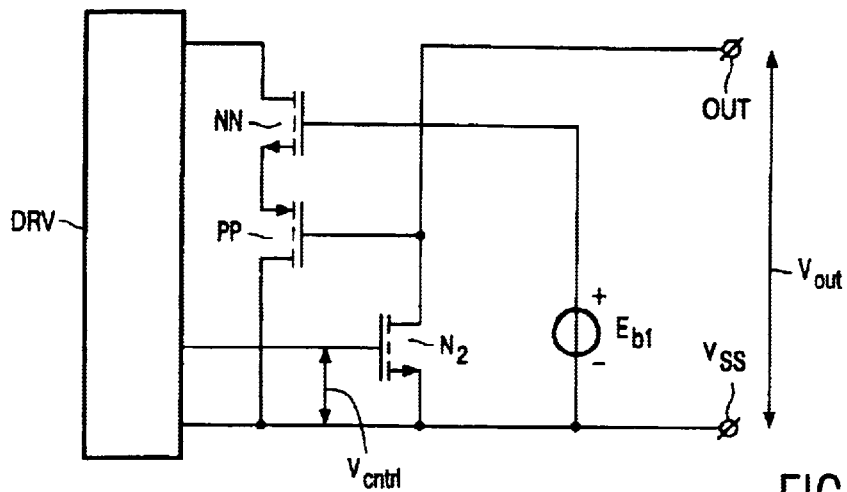
FIG. 4 is a circuit diagram of another generalized form of the clamp circuit according to FIG. 2.
Figure 5:
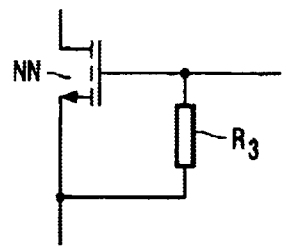
FIG. 5 is a circuit diagram of a circuit for detecting whether a certain voltage is too low.
Figure 6:
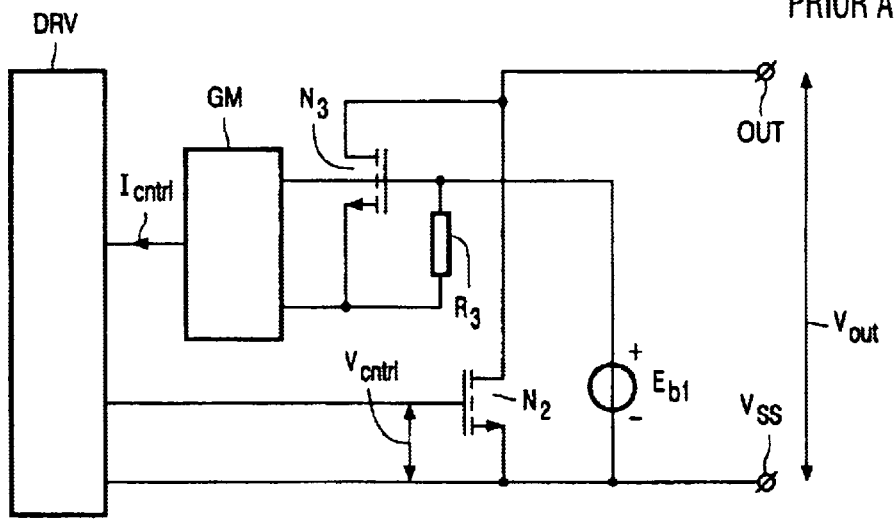
FIG. 6 is a circuit diagram of a first embodiment of an electronic circuit according to the invention.

FIG. 6 shows schematically an amplifier having a driving circuit DRV (input stage) and an output stage. Only output transistor $N_2$ is shown in the output stage. In fact the amplifier can be implemented in many ways, for instance in the way as shown in FIG. 1. The circuit further comprises level detection means implemented by sensing transistor $N_3$ and resistor $R_3$, and transconductor means GM. The operation of the circuit is as follows:

The gate of $N_3$ is biased at an appropriate DC voltage, here symbolized by voltage $E_{b1}$ with respect to the source of $N_2$. The size of transistor $N_3$ may be small, which minimizes the parasitic capacitive load. The source of sensing transistor $N_3$ is connected to the input of the transconductor GM. In normal operation of output transistor $N_2$ (at sufficiently high drain voltage) sensing transistor $N_3$ is in saturation and is cut off, and its source voltage is approximately constant and approximately equal to $E_{b1}$. Transconductor GM is designed such that under these circumstances it is not activated, so it has a negligible output current $I_{cntrl}$.

When $N_2$'s drain voltage decreases, the drain-to-source voltage of sensing transistor $N_3$ also decreases. As long as $N_3$ is in saturation, its source voltage is approximately constant, though. Finally $N_3$ enters the linear region and $N_3$'s source voltage will decrease approximately linearly with the drain voltage. This will activate the transconductor GM to produce an output current $I_{cntrl}$. The transconductor GM output current is applied in the driving circuit DRV to reduce the gate drive $V_{cntrl}$ for output transistor $N_2$ such that $N_2$ is kept in its saturation region. In fact this takes place in an analogue feedback loop. Sensing transistor $N_3$ enters its linear region essentially before the output transistor $N_2$ would do in the known circuit.

Figure 7:
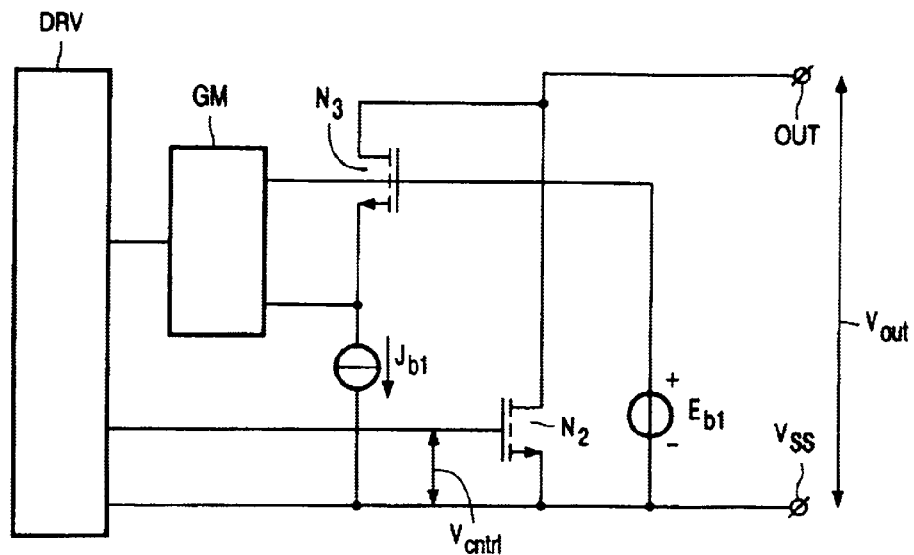
FIG. 7 is a circuit diagram of a second embodiment of an electronic circuit according to the invention.

FIG. 7 shows an alternative implementation of a circuit according to the invention. Compared to FIG. 6 the resistor $R_3$ is removed and the sensing transistor $N_3$ is biased by a current source $J_{b1}$. In normal operation of output transistor $N_2$ sensing transistor $N_3$ is in saturation and conducts a current of value $J_{b1}$. Contrary to the circuit of FIG. 6 the source voltage will be lower than the gate bias voltage $E_{b1}$. Transconductor GM is designed such that its output current $I_{cntrl}$ is negligible in these circumstances.

Whenever $N_3$ enters the linear region its source voltage decreases and the transconductor GM is activated. In analogy to the circuit principle of FIG. 6, the analogue clamping feedback loop, which is formed with the driving circuit DRV, keeps output transistor $N_2$ in its saturation region.

Figure 8:
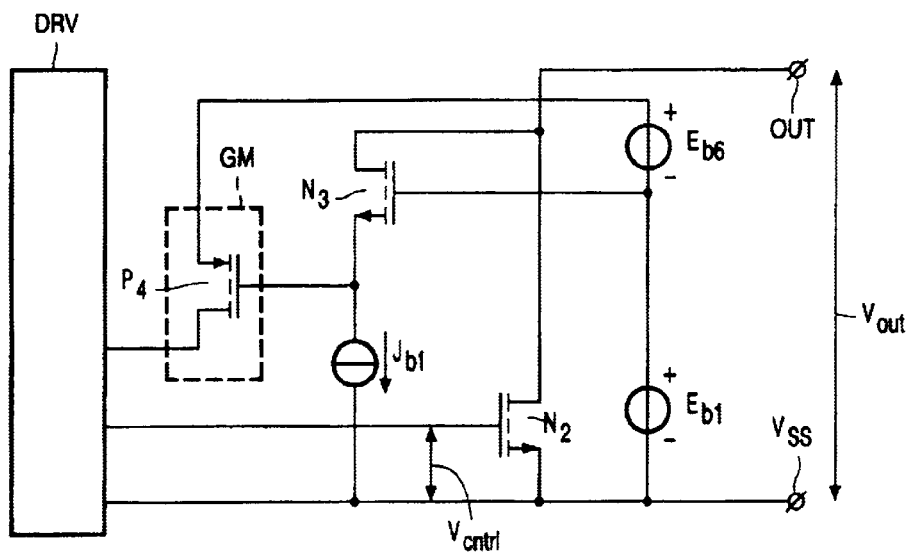
FIG. 8 is a circuit diagram of a third embodiment of an electronic circuit according to the invention.

FIG. 8 shows the circuit of FIG. 7 in which the transconductor GM is implemented by transconductor transistor $P_4$. In normal operation sensing transistor $N_3$ is in saturation, and bias voltage source $E_{b6}$ is chosen such that transistor $P_4$ is cut off. When $N_3$ enters the linear region its gate-source voltage increases, which activates $P_4$ to convert its gate-source voltage change to an output current change.

Figure 9:
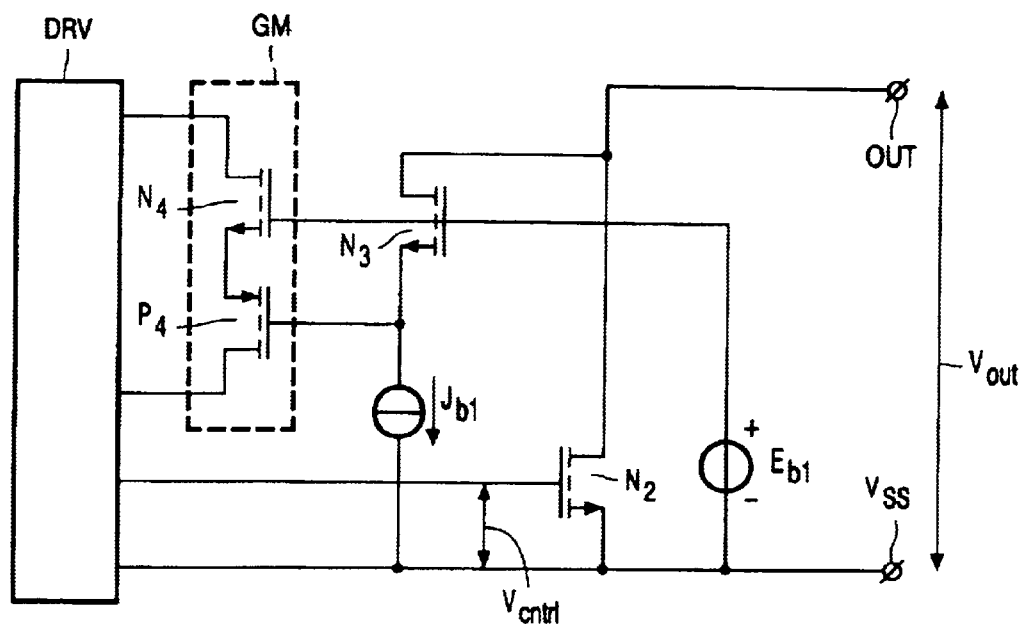
FIG. 9 is a circuit diagram of a fourth embodiment of an electronic circuit according to the invention.

The transconductor GM can also be implemented with a complementary pair of transistors $N_4/P_4$, as shown in FIG. 9. The gate of $N_4$ is coupled to the gate of $N_3$, e.g. by means of a direct connection, as shown in FIG. 9. In normal operation sensing transistor $N_3$ is in saturation and its gate-source voltage is smaller than the sum of threshold voltages of the complementary pair $N_4$ and $P_4$, such that $N_4$ and $P_4$ are cut off. When $N_3$ enters the linear region its gate-source voltage increases and finally goes beyond the sum of threshold voltages of $N_4$ and $P_4$. The complementary pair $N_4/P_4$ is activated and behaves as a transconductor, converting an input voltage difference to an output current change $I_{cntrl}$.

Figure 10:
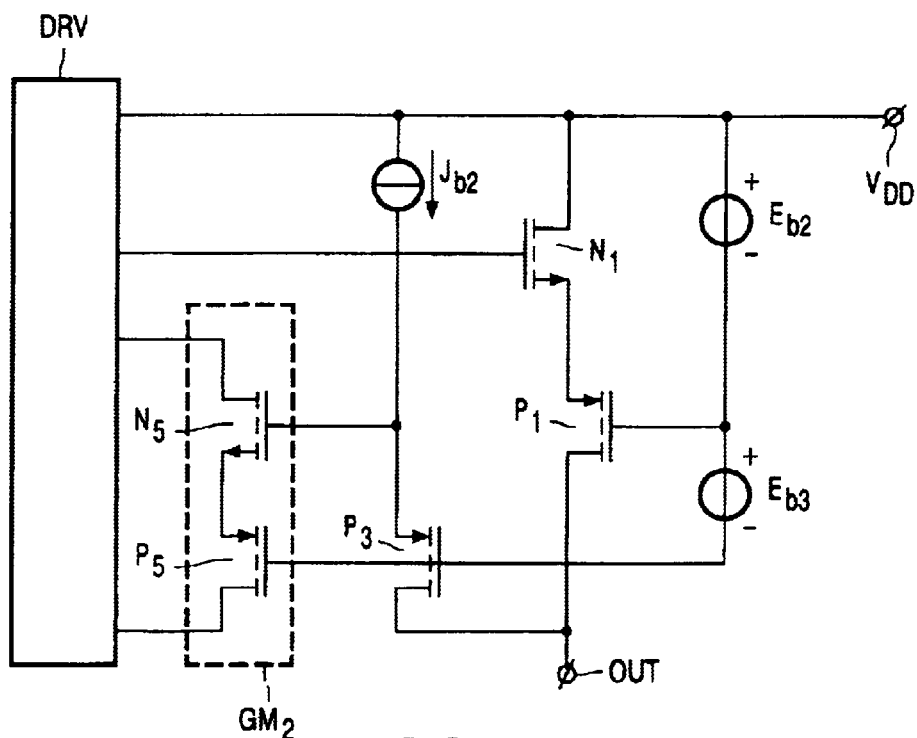
FIG. 10 is a circuit diagram of a fifth embodiment of an electronic circuit according to the invention.

In FIG. 6, FIG. 7, FIG. 8 and FIG. 9 the gate voltage of the sensing transistor $N_3$ is coupled to $N_2$'s source voltage by means of bias voltage source $E_{b1}$, but it can also be coupled to the output transistor's gate voltage. In FIG. 10 the invention is applied to the high-side complementary output pair $N_1/P_1$ of FIG. 1. The current in $N_5/P_5$ can be used in the driving circuit DRV to close the feedback loop to keep output transistor $P_1$ in its saturation region.

Figure 11:
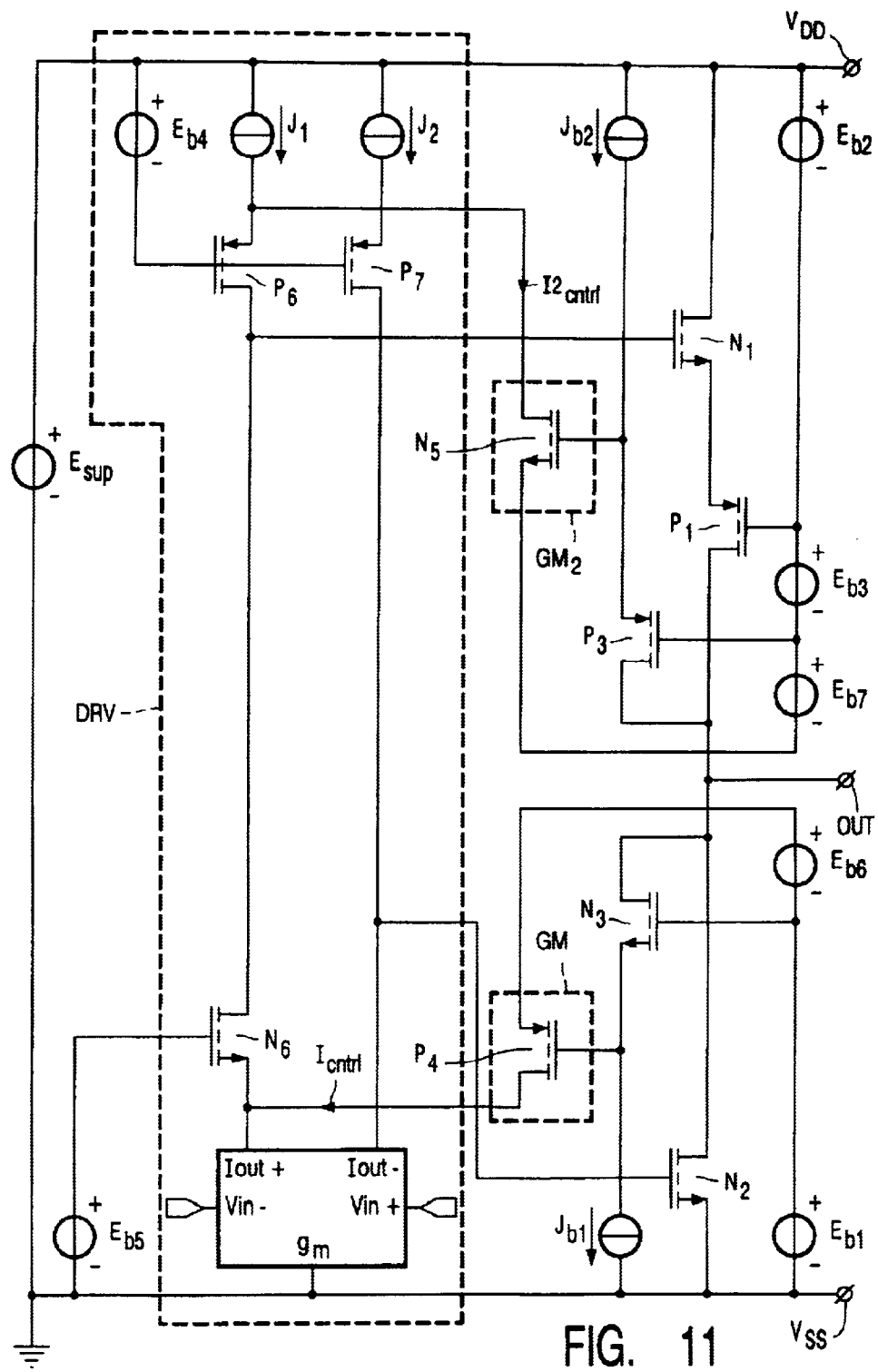
FIG. 11 is a circuit diagram of a sixth embodiment of an electronic circuit according to the invention.
Figure 12:
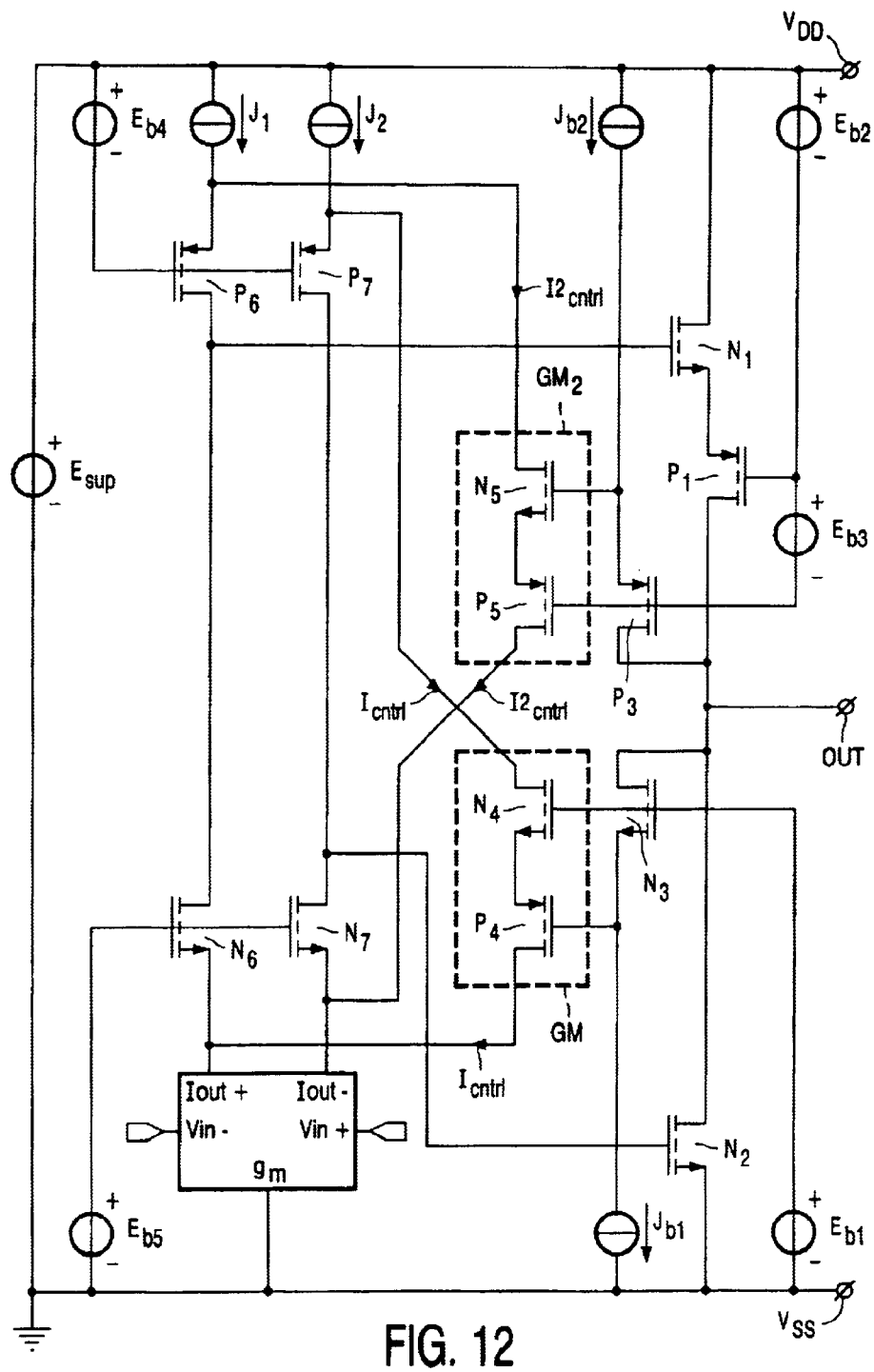
FIG. 12 is a circuit diagram of a seventh embodiment of an electronic circuit according to the invention.

The circuits and clamping principles of FIG. 8, FIG. 9 and FIG. 10 can be combined with the amplifier of FIG. 1, as shown in FIG. 11. In FIGS. 11–14 GM and $GM_2$ have similar functions. This is also true with respect to $I_{cntrl}$ and $I2_{cntrl}$ Preferably, parasitic capacitances at the gates of $N_1$ and $N_2$ are minimized. The output currents of the transistors $P_4$ respectively $N_5$ therefore are inserted at the sources of common-gate-biased transistors. P-type transistors $P_6$ and $P_7$ serve as cascode transistors to the common-mode current sources $J_1$ and $J_2$. Their gates are biased by bias voltage source $E_{b4}$. N-type transistor $N_6$ serves as cascode transistor for the differential-mode transconductor GM at the amplifier inputs, and is biased by bias voltage source $E_{b5}$. Transistor $N_5$ is activated when the output voltage rises too much, and draws a current from the left amplifier branch at the source of $P_6$. Transistor $P_4$ is activated when the output voltage decreases too much, and delivers a current into the left branch at the source of $N_6$. Whenever either one of the transistors $P_4$ or $N_5$ is activated the common-mode control loop (which is not shown in the figures, it is however generally known that differential amplifiers having differential outputs do need such control loops) is influenced. It therefore is better to insert differential mode currents, as shown in FIG. 12.

The complementary pair $N_5/P_5$ is activated when the output voltage $V_{out}$ rises too much, and draws a current $I2_{cntrl}$ from the left amplifier branch (at the source of $P_6$) and delivers it into the right branch (into the source of $N_7$).

The complementary pair $N_4/P_4$ is activated when the output voltage $V_{out}$ decreases too much, and draws a current $I_{cntrl}$ from the right amplifier branch (at the source of $P_7$) and delivers it into the left branch (into the source of $N_6$).

Both clamping mechanisms produce differential-mode currents counteracting the differential-mode current from the differential-mode transconductor $g_m$. Thus the common-mode current is unaltered and either one of the clamping circuits does not influence the common-mode control loop.

Figure 13:
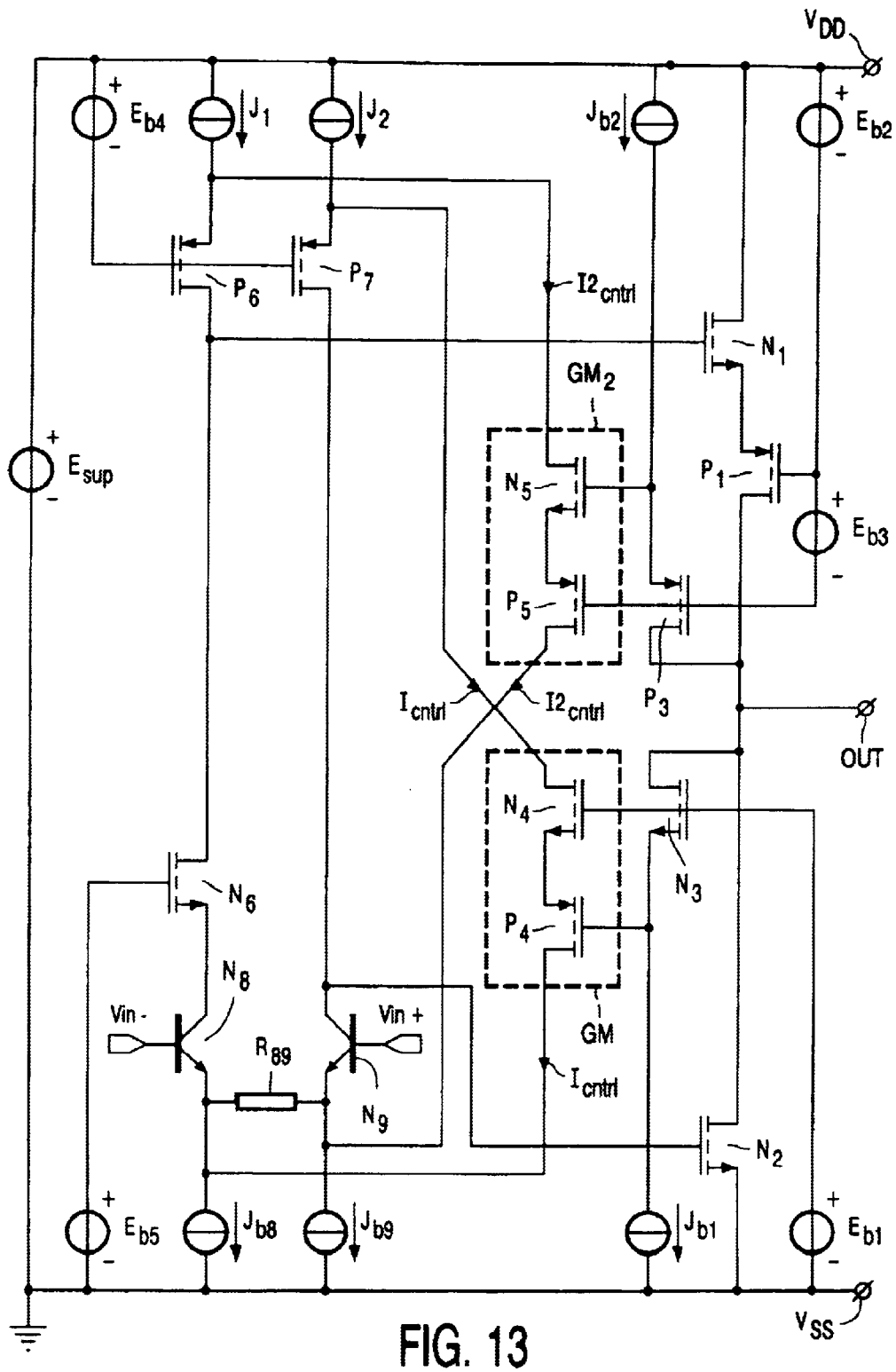
FIG. 13 is a circuit diagram of an eighth embodiment of an electronic circuit according to the invention.

Another example is shown in FIG. 13. NPN transistors $N_8$ and $N_9$ together with resistor $R_{89}$ form the input differential transconductor, biased by current sources $J_{b8}$ and $J_{b9}$. The drain currents of P-type MOS transistors $P_4$ and $P_5$ are inserted at the emitters of the input transistors $N_8$ and $N_9$.

Figure 14:
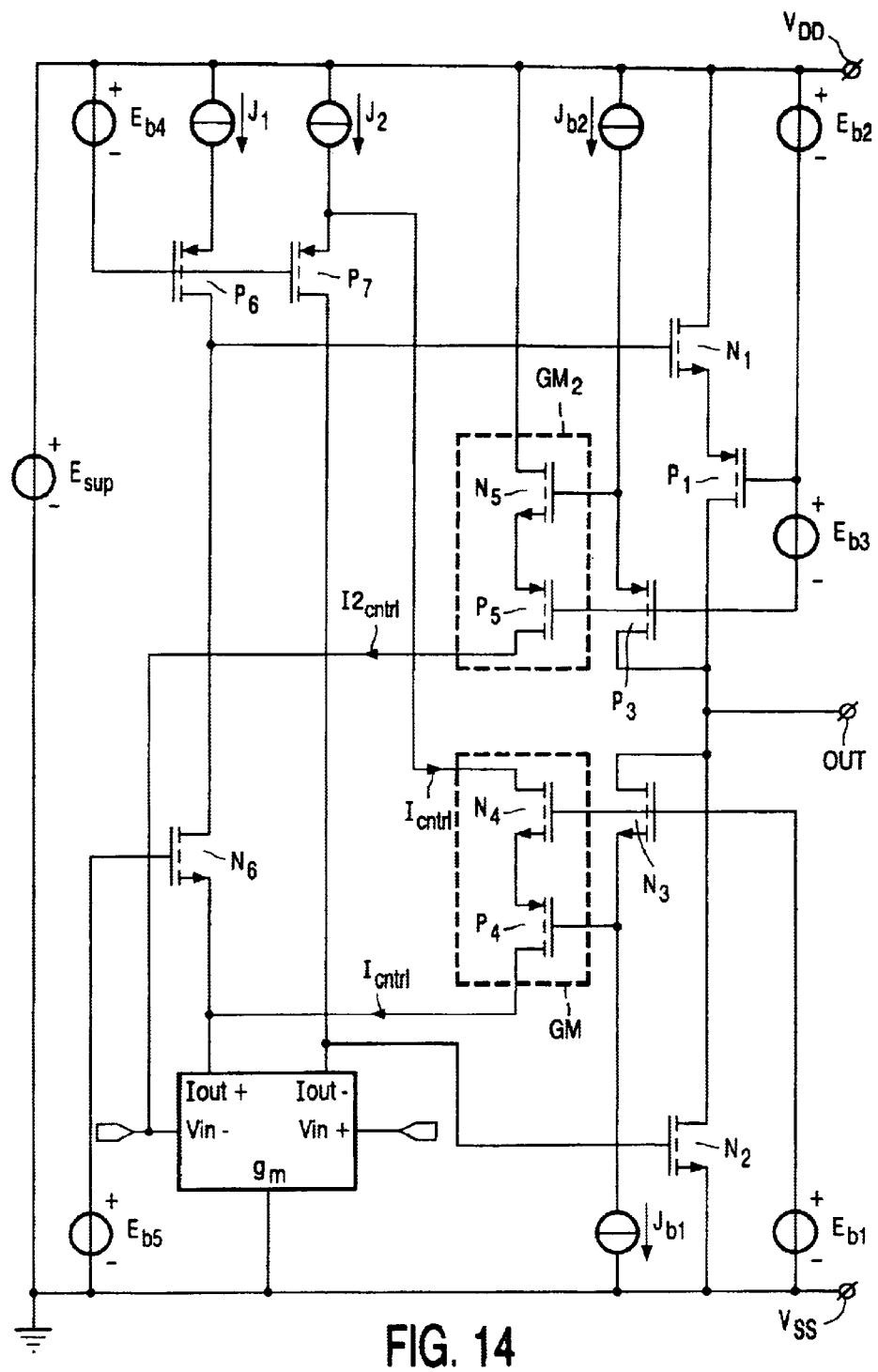
FIG. 14 is a circuit diagram of a ninth embodiment of an electronic circuit according to the invention.

Normally the amplifiers are applied in negative feedback configuration with a signal voltage attenuator from output to inverting input (not shown). The attenuator usually consists of resistors and/or capacitors. This offers the opportunity to use the inverting input for clamping purposes as well: the channel current of the transconductor $N_5/P_5$ (or $N_4/P_4$)3 need not necessarily be applied to the driving electronics in differential form. FIG. 14 shows an amplifier in which the drain of the n-type transistor $N_5$ is tied to the positive supply voltage and the drain of the p-type transistor $P_5$ is tied to the inverting input of the amplifier. Thus again, the common-mode control loop, which controls the values of current sources $J_1$ and $J_2$, is not influenced when the complementary pair $N_5/P_5$ is activated.

There are many more ways to feed back the channel currents of the transconductor (e.g. $N_4/P_4$ or $N_5/P_5$) into the driving electronics, and close the clamping feedback loop. The way it is done may have consequences for the stability and bandwidth of the clamping feedback loop, which in fact has to overrule the normal signal path whenever either one of the output transistors has to be clamped. For that reason it is mandatory that the clamping feedback loop has at least the same bandwidth as the normal signal path, but preferably has a higher bandwidth. In that sense the circuit of FIG. 13 is to be preferred above the circuit of FIG. 14: the clamping feedback loop encloses less transistors in FIG. 13 and thus has less poles, which in general favors stability.

In the figures most transistors are shown as field effect transistors by way of example. They can however, be replaced party or wholly by bipolar transistors. Further in FIG. 13 the input transistors $N_8$ and $N_9$ can be replaced by MOS transistors.

Further P-type and N-type transistors can be replaced by N-type and P-type transistors.

What is claimed is:

1. An electronic circuit, comprising:
   an amplifier comprising an output terminal, which supplies an output signal to a load, the amplifier including an output transistor having a first main terminal coupled to a supply voltage terminal of the amplifier, a second main terminal coupled to the output terminal (OUT), and a control terminal; and
   a controller, which includes a transconductor device, and which is adapted to prevent the output transistor from entering its linear state, the controller being arranged to reduce a control voltage between the control terminal and the first main terminal when an output voltage between the second main terminal and the first main terminal is below a defined level.

2. An electronic circuit as claimed in claim 1, wherein the controller comprises a level detector, which during operation of the electronic circuit, supplies a substantial change in voltage difference when the output voltage becomes lower than the defined level, and wherein the transconductor device supplies a control current to the amplifier to reduce the control voltage in response to the control current.

3. An electronic circuit as claimed in claim 2, wherein the level detector comprises a level detection transistor having a control terminal coupled adapted to receive a reference voltage, a first main terminal, and a second main terminal coupled to the output terminal, and a resistive path coupled between the control terminal and the first main terminal of the level detection transistor, and wherein the voltage between the control terminal and the first main terminal of the level detection transistor forms the voltage difference.

4. An electronic circuit as claimed in claim 2, wherein the level detector comprises a level detection transistor having a control terminal coupled for receiving a reference voltage, a first main terminal, and a second main terminal coupled to the output terminal, and a current source coupled between the first main terminal of the level detection transistor and the supply Voltage terminal, wherein the voltage between the control terminal and the first main terminal of the level detection transistor forms the voltage difference.

5. An electronic circuit as claimed in claim 2, wherein the transconductor device comprises a transconductor transistor having a first main terminal, a second main terminal, and a control terminal, and the control terminal and the first main terminal are coupled to receive a voltage between the control terminal and the first main terminal of the transconductor transistor which is dependent on the aforementioned voltage difference, and the second main terminal of the transconductor transistor delivers the control current during operation of the electronic circuit.

6. An electronic circuit, comprising:

an amplifier comprising an output terminal for supplying an output signal to a load, the amplifier comprising an output transistor having a first main terminal coupled to a supply voltage terminal of the amplifier, a second main terminal coupled to the output terminal, and a control terminal; and control means for avoiding the output transistor to enter its linear state, the control means being arranged to reduce a control voltage between the control terminal and the first main terminal when an output voltage between the second main terminal and the first main terminal is below a defined level, wherein the control means comprises level detection means for supplying, during operation of the electronic circuit, a substantial change in voltage difference when the output voltage becomes lower than the defined level, and transconductor means for supplying a control current to the amplifier for reducing the control voltage on respond to the control current.

* * * * *